(12) United States Patent
Chang

(10) Patent No.: US 6,392,273 B1
(45) Date of Patent: May 21, 2002

(54) TRENCH INSULATED-GATE BIPOLAR TRANSISTOR WITH IMPROVED SAFE-OPERATING-AREA

(75) Inventor: Hsueh-Rong Chang, Thousand Oaks, CA (US)

(73) Assignee: Rockwell Science Center, LLC, Thousand Oaks, CA (US)

( * ) Notice: Subject to any disclaimer, the term of this patent is extended or adjusted under 35 U.S.C. 154(b) by 0 days.

(21) Appl. No.: 09/483,605

(22) Filed: Jan. 14, 2000

(51) Int. Cl.$^7$ ............................................. H01L 29/792

(52) U.S. Cl. ..................... 257/330; 257/331; 257/341; 257/378

(58) Field of Search .................... 257/262, 263, 257/586, 577, 583, 330, 197, 273, 328, 329, 331, 341, 339, 139, 147, 378; 438/344, 192

(56) References Cited

U.S. PATENT DOCUMENTS

| | | | | |
|---|---|---|---|---|
| 5,304,821 A | * | 4/1994 | Hagino | 257/133 |
| 5,471,075 A | * | 11/1995 | Shekar et al. | 257/139 |
| 5,751,024 A | * | 5/1998 | Takahashi | 257/139 |
| 5,894,149 A | * | 4/1999 | Uenishi et al. | 257/331 |
| 6,110,799 A | * | 8/2000 | Huang | 438/430 |
| 6,225,649 B1 | * | 5/2001 | Minato | 257/133 |

OTHER PUBLICATIONS

Chang, H.–R. and Baliga, Jayant, "500–V n–Channel Insulated–Gate Bipolar Transistor With a Trench Gate Structure", (Sep. 1989) *IEEE Transactions on Electron Devices*, vol. 36 No. 9, pp. 1824–1828.

* cited by examiner

Primary Examiner—Tom Thomas
Assistant Examiner—Douglas W. Owens
(74) Attorney, Agent, or Firm—Koppel, Jacobs, Patrick & Heybl

(57) ABSTRACT

A trench insulated-gate bipolar transistor (IGBT) comprises a number of trench-IGBT structures interdigitated with bipolar transistor (BJT) structures in a drift layer, with trench gates separating the structures. Shallow P regions span the bottom corners of respective trench gates to protect the trench oxide from high peak electric fields encountered when the device is reverse-biased. Because no inversion channels form across the BJT mesas in response to a gate voltage, base drive and thus the device's saturation current level is reduced and a robust short-circuit SOA is provided. The ratio of IGBT structures to BJT structures is adjusted as needed to obtain a desired saturation current level and short-circuit SOA. The higher forward voltage drop incurred by the introduction of BJT structures is countered by increasing the depth of the trench gates, causing longer accumulation channels to form along the gates' sidewalls which enhance the device's injection efficiency and lower its forward voltage drop. An N-type layer extending above and below the shallow P regions counters the increase in on-resistance brought about by their encroachment into the IGBT and BJT mesas.

22 Claims, 6 Drawing Sheets

TRENCH INSULATED-GATE BIPOLAR TRANSISTOR WITH IMPROVED SAFE-OPERATING-AREA

BACKGROUND OF THE INVENTION

1. Field of the Invention

This invention relates to the field of semiconductor switching devices, and particularly to switching devices used in high-power switching circuits.

2. Description of the Related Art

Semiconductor devices are increasingly required to accommodate high currents and/or high voltages without failing. Many applications, such as pulse-width modulated motor-control circuits, require high-power switching devices. A number of devices have been developed to provide the high current and reverse blocking characteristics needed in a high power switch. The available devices offer various levels of performance for the primary parameters of interest, such as forward voltage drop $V_{FD}$ and safe-operating-area (SOA). SOA is defined as the current-voltage boundary within which a power switching device can be operated without destructive failure, and is typically specified for both short-circuit and reverse-biased operating conditions.

One such device is the insulated-gate bipolar transistor (IGBT). An IGBT with a trench gate structure has been shown to provide performance superior to that of a standard IGBT having a planar structure; one such trench-IGBT structure is shown in FIG. 1. A P layer 10 and an N− drift layer 12 are stacked on a collector terminal C. Each IGBT structure is built on these common layers by adding a P base region 14 on N− drift layer 12, and an N+ region 16 within the P base region. A thin P+ layer 18 provides an ohmic contact to the P base region. An emitter terminal E contacts both the ohmic contact 18 and N+ region 16. Similar structures are spaced periodically across the device, with each structure's emitter terminal connected together to provide a common emitter connection. Each structure is separated by a trench gate 20 which is recessed into the N− drift layer. Each gate is made from a layer of oxide 22 which contacts the N+ and P base regions of adjacent IGBT structures and the N− drift layer between them, a conductive material 24 which fills the trench, and an electrode (not shown) which contacts the conductive material; each gate electrode is connected together to provide a gate connection G. This device is described in detail in H.-R. Chang and B. Baliga, "500-V n-Channel Insulated-Gate Bipolar Transistor with a Trench Gate Structure", IEEE Transactions on Electron Devices, Vol. 36, No. 9, September 1989, pp. 1824–1828.

In operation, a positive voltage is applied to gate terminal G. This forms inversion channels across the P base regions and accumulation channels along the trench sidewalls and bottom in the N− drift layer, allowing electrons to flow from the N+ regions to the N− drift layer through the channels. These electrons provide the base drive needed to turn on the PNP transistor formed between collector C and emitter E. The P layer responds by injecting holes into the N-drift layer, allowing current to flow from the collector C to the emitter E. The IGBT is turned off by simply making the gate voltage zero or negative, which removes the inversion channels and thus the transistors' base drive.

The use of a trench gate structure enables an IGBT per FIG. 1 to have a very high channel density; i.e., many such structures can be fabricated side by side in a given die area. This results in the device having a very high saturation current level. Unfortunately, when such a device is short-circuited, the high saturation current level can result in the device's destruction. As such, the device's short-circuit SOA tends to be poor. One possible solution to this problem is the use of external short-circuit protection circuitry; however, such circuitry adds undesirable cost and complexity to the device.

Another possible solution for a poor short-circuit SOA is to widen the mesa regions of the device, i.e., those regions located between the trench gates, to reduce channel density and thereby lower the saturation current level. Unfortunately, a wider mesa degrades the field distribution induced across the mesa by the sidewall oxide. This adversely affects the device's reverse blocking capability and lowers its reverse-biased SOA.

SUMMARY OF THE INVENTION

A trench-IGBT with improved SOA is presented that overcomes the problems noted above. The new IGBT is particularly well-suited to high-power switching applications, providing simple gate voltage control of switching, low $V_{FD}$, and robust short-circuit SOA and reverse-biased SOA.

The novel structure contains a number of trench-IGBT structures, but reduces the channel density of a conventional trench-IGBT device by interdigitating a number of bipolar transistor (BJT) structures with the IGBT structures. Because no inversion channels form across the BJT mesas when a positive gate voltage is applied, base drive and thus the device's saturation current level is reduced (when compared with an all-IGBT implementation), and its short-circuit SOA thereby improved. Furthermore, because the novel structure does not require a wider mesa, reverse-biased SOA is unaffected. The ratio of BJT structures to IGBT structures is adjusted as needed to obtain a desired saturation current level and short-circuit SOA.

The novel device includes shallow P regions around the bottom corners of respective trench gates to protect the trench oxide from high peak electric fields encountered when the device is reverse-biased. To counter the increased on-resistance that can be caused by the encroachment of these shallow P regions into the mesa regions, an N-type layer is added which spans the mesa regions and extends above and below the shallow P regions. The N-type layer has a lower resistance than the N− drift layer, and thus lowers the resistance through the area of encroachment. The shallow P regions can also be expanded to span the mesa regions of the BJT structures, to lower their forward voltage drop.

The introduction of BJT structures as described herein tends to slightly increase the device's on-resistance and $V_{FD}$ in comparison with a device configured in accordance with FIG. 1. Besides employing an N-type layer as described above, the increased on-resistance can also be countered by increasing the depth of the trench gates, which increases the length of the accumulation channels formed along the trench sidewalls by the application of a positive gate voltage. This enhances the device's electron injection efficiency, increases the conductivity modulation in the N− drift region, and lowers the device's forward voltage drop.

Further features and advantages of the invention will be apparent to those skilled in the art from the following detailed description, taken together with the accompanying drawings.

BRIEF DESCRIPTION OF THE DRAWINGS

FIG. 3 is a sectional view of the device of FIG. 2, illustrating the mechanism by which it is switched on.

FIG. 5b is a sectional view of the device of FIG. 2 illustrating an alternative embodiment of the enhancement shown in FIG. 5a.

DETAILED DESCRIPTION OF THE INVENTION

Figure 2:
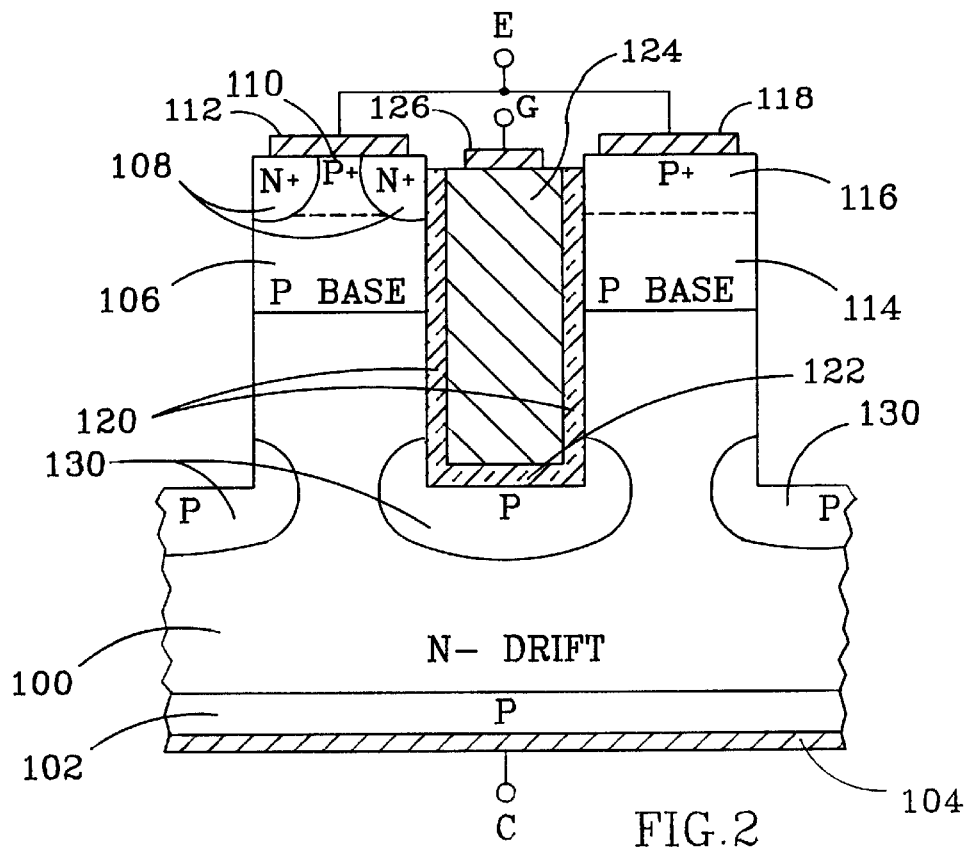
FIG. 2 is a sectional view of a trench-IGBT with improved SOA per the present invention.

An exemplary embodiment of a trench-IGBT with improved SOA is shown in FIG. 2. A foundation for the device is formed from an N– drift layer 100 on a P layer 102. An electrode 104 contacts the P layer 102 and serves as the device's collector terminal C. Two types of structures are built on this foundation: insulated-gate bipolar transistors (IGBTs) and bipolar transistors (BJTs). An IGBT structure is formed with the addition of a P base region 106 on N– drift layer 100, with an N+ region 108 occupying the upper corners of the P base region. A shallow P+region 110 on P base region 106 provides an ohmic contact to the P base. An electrode 112 contacts both the P+ ohmic contact and N+ regions of the IGBT. As used herein, a "+" (i.e., P+ or N+) denotes a carrier concentration of at least $1 \times 10^{18}/cm^3$, and a "–" denotes a carrier concentration of less than $5 \times 10^{16}/cm^3$.

A BJT structure (a PNP transistor in this illustration) is formed on the P/N– drift foundation by stacking a P base region 114 on N– drift layer 100. A P+ region 116 on P base region 114 provides an ohmic contact to the P base, and an electrode 118 contacts the P+ region. BJT electrode 118 and IGBT electrode 112 are connected together to provide the device's emitter terminal E.

A trench gate structure is recessed into N– drift layer 100 between the IGBT and BJT structures, separating the IGBT's P base and N+ regions from the BJT's P base region. The trench gate structure includes a pair of oxide sidewalls 120 and an oxide bottom 122; sidewalls 120 are preferably approximately vertical, and bottom 122 is preferably approximately horizontal. The trench is filled with a conductive material 124 to provide a planar device surface. An electrode 126 contacts the conductive material and provides a gate terminal G. Because it easily fills the trench, the conductive material 124 is preferably polysilicon that has been heavily doped with donors (for an n-channel IGBT); however, other materials that can fill the trenches and provide good conductivity could also be used.

The robustness of the device's reverse breakdown characteristic is enhanced with the use of a shallow, lightly-doped P region 130 in the N– drift layer adjacent to the trench bottom 122. The P region is made wide enough to span the corners of the trench (where the trench's oxide sidewalls meet its oxide bottom), but shallow enough (preferably <0.5 μm deep) to avoid lateral diffusion which would increase on-resistance by pinching off the mesa regions. The charge implanted into the P region should be adequate to allow the peak electric field to be present in P region 130, and not in the trench oxide; a charge of at least $3 \times 10^{12}/cm^2$ is typically adequate for a 1200 volt device. Employing a P region in this way protects the trench oxide from high peak electric fields encountered when the device is reverse-biased; these fields can cause the device to break down prematurely. The oxide corners are particularly susceptible to premature breakdown, so that P region 130 should span both trench corners if adequate protection is to be afforded.

Figure 3:
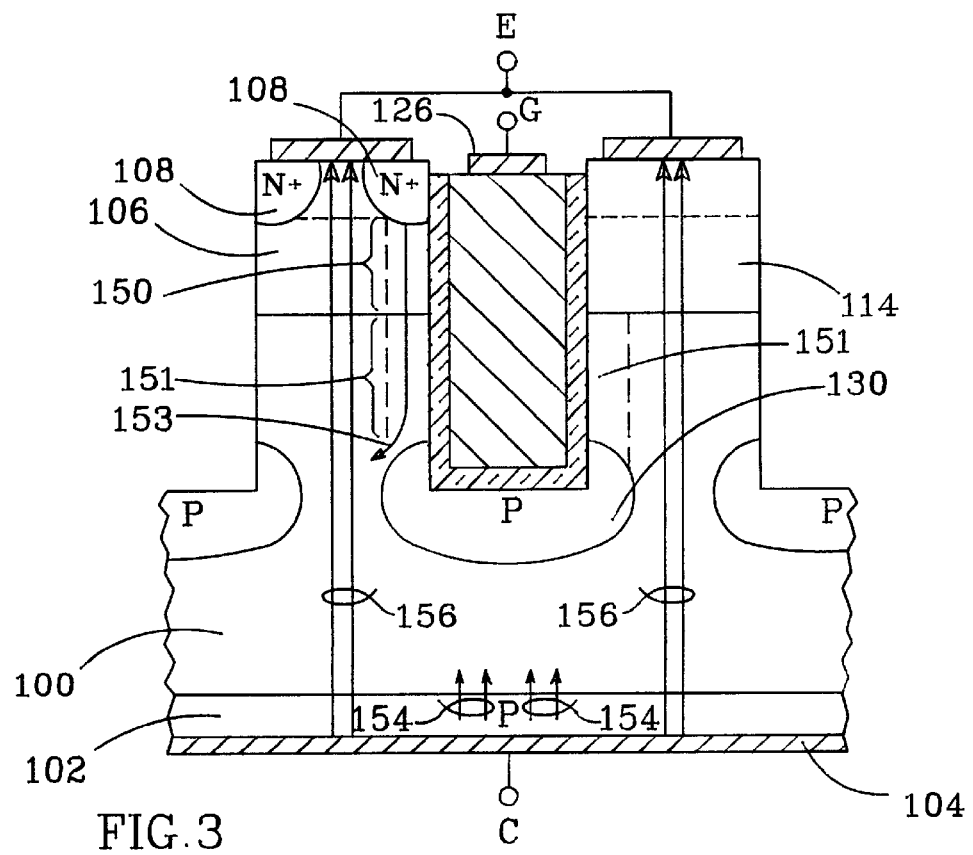

The mechanism by which the device is switched on is illustrated in FIG. 3. A positive voltage is applied to gate terminal G. This causes an N-type inversion channel 150 to form across P base region 106 of the IGBT, and an accumulation channel 151 to form adjacent to the trench gate sidewalls (no accumulation channel forms along the trench bottom due to the presence of shallow P region 130). Inversion channel 150 and accumulation channel 151 allow electrons to flow from the IGBT's N+ region 108 to N– drift layer 100 (as indicated by arrow 153), providing base drive to both the ICBT structure and the BJT structure. In response, holes are injected (arrows 154) from the collector into N-drift layer 100. As indicated by arrows 156, current flows through the device via both the IGBT and BJT structures as the injected holes cross the N– drift layer and are collected at the emitter.

As described in more detail below, a practical high power switching device would typically include hundreds of IGBT and BJT structures interdigitated across a die. As noted above, if all such structures are trench-IGBTs, the resulting device has a very high channel density and thus a high saturation current level, which in turn results in a poor short-circuit SOA. The invention solves this problem by interdigitating a number of BJT structures with the IGBT structures (as illustrated in FIG. 2). Because no inversion channels form across the BJT mesas in response to a positive gate voltage, base drive is reduced in comparison with an all-trench-IGBT implementation. Saturation current level is determined by the magnitude of the base drive, so that the lower base drive brought about by the use of the BJT structures lowers the device's saturation current level. Thus, short-circuit SOA is improved without resorting to a wider mesa width, so that reverse-biased SOA is not degraded. The ratio of IGBT structures to BJT structures is selected to obtain a desired saturation current level, with higher and lower ratios increasing and decreasing the saturation current level, respectively.

One disadvantage of interdigitating BJT structures as described herein is that their forward voltage drop tends to be higher than that of the IGBT structures, thereby increasing the overall device's forward voltage drop. The invention preferably compensates for this by increasing the depth of the trench gates to a typical depth of about 10 μm, as compared with a trench depth of 3–4 μm found in conventional trench-IGBTs. In such a conventional device, a positive gate voltage induces a short accumulation channel (1–2 μm) along the trench gate sidewall, which slightly enhances electron injection efficiency. With trench depth increased as described herein, a considerably longer (~7μm) accumulation channel 151 is formed along the trench gate sidewalls.

The longer accumulation channel further enhances the electron injection efficiency and thus the conductivity modulation in the N− drift layer, lowering the forward voltage drop of the device and thereby offsetting the increase in forward drop brought about by the BJT structures.

Note that while an increased trench depth is preferred to offset the increase in forward voltage drop brought about by the BJT structures, it is not essential to the invention. The saturation current level control and improved SOA provided by the interdigitation of the BJT structures is still realized even when trench gates of conventional depth are employed in the device.

Figure 4:
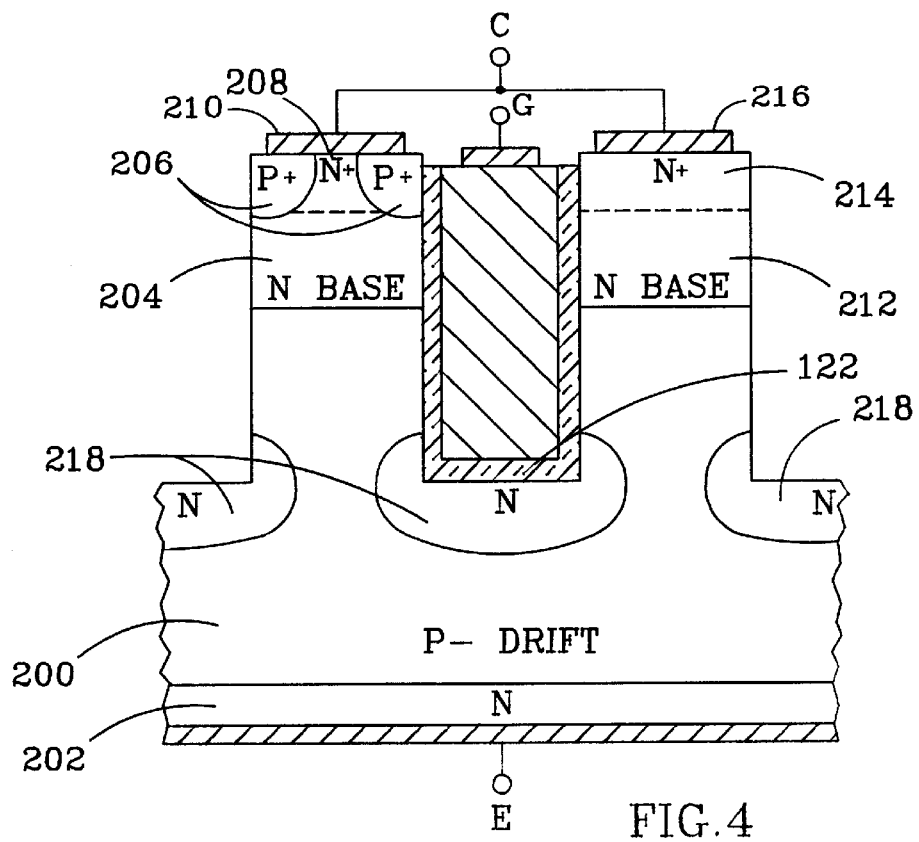
FIG. 4 is a sectional view of an opposite-polarity version of the device of FIG. 2.

While the trench-IGBT with improved SOA shown in FIGS. 2 and 3 is depicted as including a PNPN IGBT structure and a PNP transistor structure, the device can just as readily utilize structures of the opposite polarity. Such a device is shown in FIG. 4. Here, the device foundation includes a P− drift layer 200 on an N layer 202, contact to which forms the device's emitter E. The IGBT structure is formed by adding an N base region 204 on the P− drift layer, with a P+ region 206 in the N base. A shallow N+ region 208 on N base region 204 provides an ohmic contact to the N base. Both the N+ ohmic contact and P+ regions are contacted by an electrode 210. The BJT structure is formed by adding an N base region 212 on the P− drift layer, with an N+ region 214 on N base region 212 providing an ohmic contact to the N base; an electrode 216 contacts the N+ region. Electrodes 210 and 216 are connected together to provide the device's collector connection C. The trench gate and gate connection G remain as before, except that the conductive material that fills the trench is preferably polysilicon that has been heavily doped with acceptors. A shallow N region 218 protects the bottom corners of the gate. The device functions essentially the same as the FIG. 2 device, except that a negative gate voltage (which respect to the collector) is needed to create the channels necessary to switch the device on.

Figure 5A:
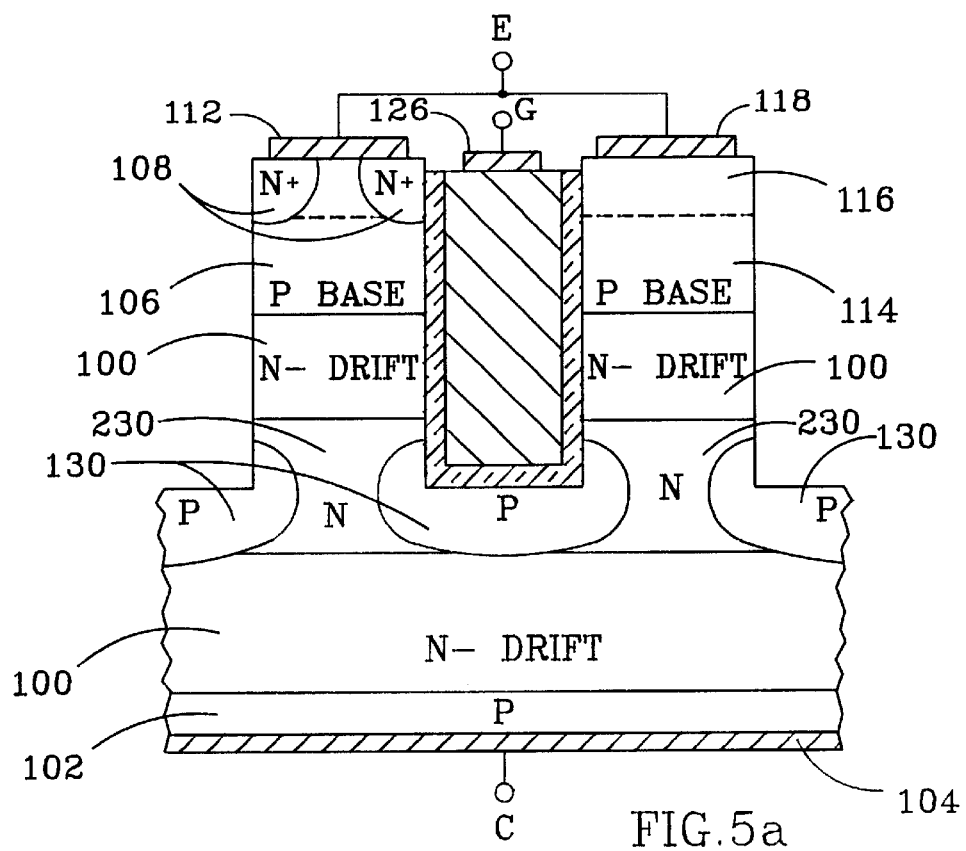
FIG. 5a is a sectional view of the device of FIG. 2 illustrating an enhancement which reduces the device's on-resistance.

Portions of the shallow P region (region 130 in FIG. 2) employed to protect the corners of the trench gate may encroach into the mesa regions between adjacent gates. This can narrow the conductive paths through the mesa regions, and thereby increase the device's on-resistance. In FIG. 5a, which illustrates the preferred embodiment of the device, this adverse effect is countered with the use of an N-type layer 230 within N− drift layer 100 which spans the mesa regions and extends above and below the portion of shallow P regions 130 encroaching into the mesa regions. The resistance of the more heavily-doped N-type layer 230 is less than that of the N− drift layer 100 which would otherwise be present around the shallow P regions, so that N-type layer 230 tends to counter the increase in resistance brought about by the encroachment of the shallow P regions. The presence of the more heavily-doped N-type layer 230 also helps to reduce the lateral diffusion of the shallow P regions 130, which serves to reduce the extent of the encroachment.

As depicted in FIG. 5a, the preferred embodiment of the trench-IGBT with improved SOA employs both a deeper trench gate and an N-type layer 230; both of these features act to reduce the device's on-resistance. N-type layer 230 should also be employed with a device having trench gates of conventional depth. Lacking such an N-type layer, the portions of shallow P region 130 encroaching into the mesa regions may adversely affect the injection of electrons from N+ region 108 to N− drift region 100 by presenting a bottleneck at the bottom of the conductive path provided by the inversion and accumulation channels formed along the trench gate sidewall. Using an N-type layer 230 reduces the lateral diffusion of shallow P region 130, and thus reduces the bottleneck at the bottom of the conductive path. For this reason, the use of an N-type layer 230 is highly recommended for devices employing trench gates of conventional depth.

Note that an opposite polarity version of the device such as that shown in FIG. 4 could employ a P-type layer (analogous to N-type layer 230) that extends above and below its shallow N region, which would provide the same benefits as N-type layer 230.

Figure 5B:
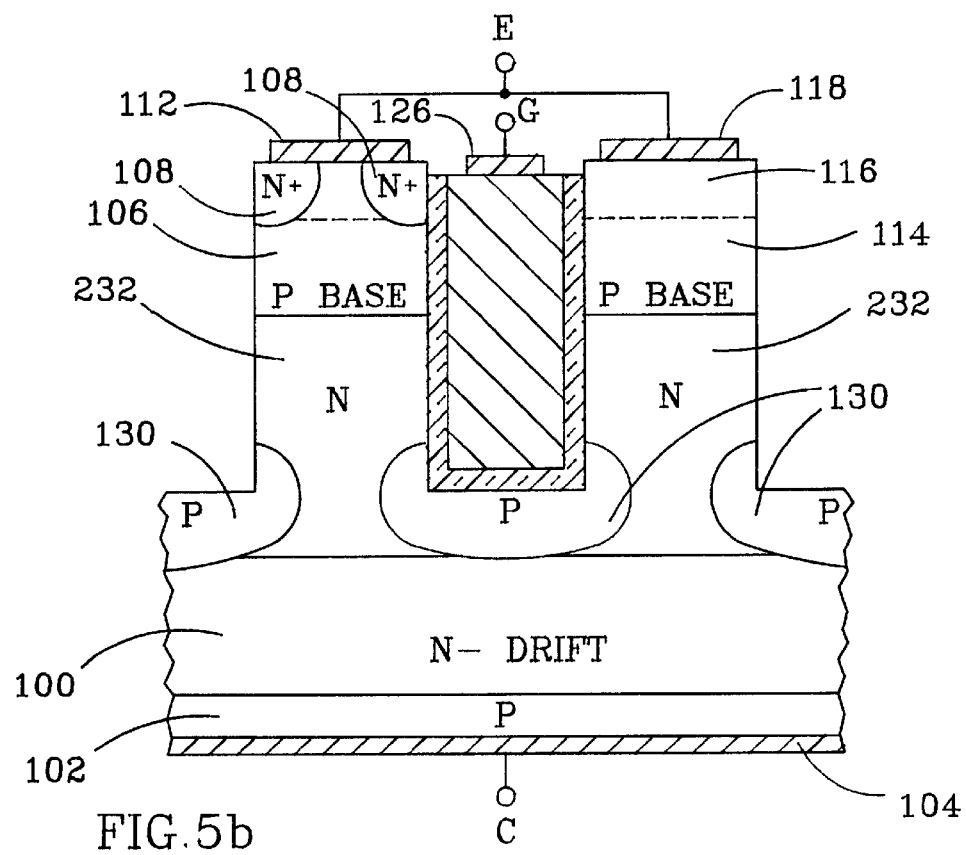

An alternative use of a more heavily-doped N-type layer is shown in FIG. 5b. Here, the N-type layer 232 extends from the bottoms of P base regions 106 and 114 to below the portions of shallow P regions 130 encroaching into the mesa regions. This approach also serves to counter the increase in resistance brought about by the encroachment of the shallow P regions into the mesa regions, and to reduce the lateral diffusion of the shallow P regions 130.

Figure 6:
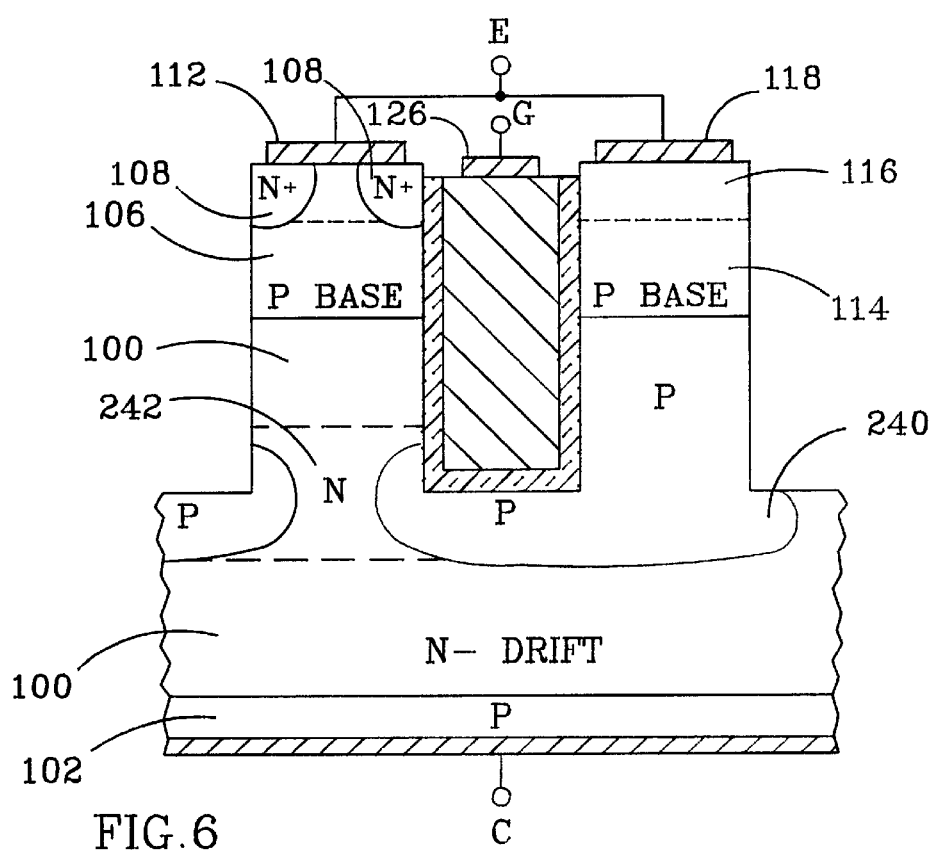
FIG. 6 is a sectional view of the device of FIG. 2 which another enhancement which reduces the device's on-resistance.

Another enhancement to the device of FIG. 2 is illustrated in FIG. 6, which also serves to counter the increase in the device's on-resistance brought about by interdigitating BJTs with the lower-resistance IGBT structures. Here, the depth of the BJT's upper P region is extended down to at least the bottom of the trench gate. One way of achieving this is by extending the shallow P region (which spanned only around the trench corners in FIGS. 2–5) across the mesa region of the BJT to form an extended shallow P region 240. Alternatively, a deeper diffusion of P base region 114 could be performed to increase the region's depth. The deeper P region enhances the conduction of the BJT and thereby lowers the voltage drop across it. While FIG. 6 shows the deeper P region used in a device having an increased trench depth, it could also be beneficially employed in a device having a conventional trench depth.

The more heavily-doped N-type layer enhancement shown in FIGS. 5a and 5b may also be employed in the device shown in FIG. 6. An N-type layer 242 which extends above and below the portions of the shallow P regions encroaching into the mesa regions may be located within N− drift layer 100 (as shown here and in FIG. 5a), or may extend from the bottom of P base region 106 to below the portions of the shallow P regions encroaching into the mesa regions (as in FIG. 5b, but not shown here). As before, the use of N-type layer 242 reduces the resistance across the IGBT structure's mesa region, and reduces the lateral diffusion of the shallow P regions.

Figure 1:
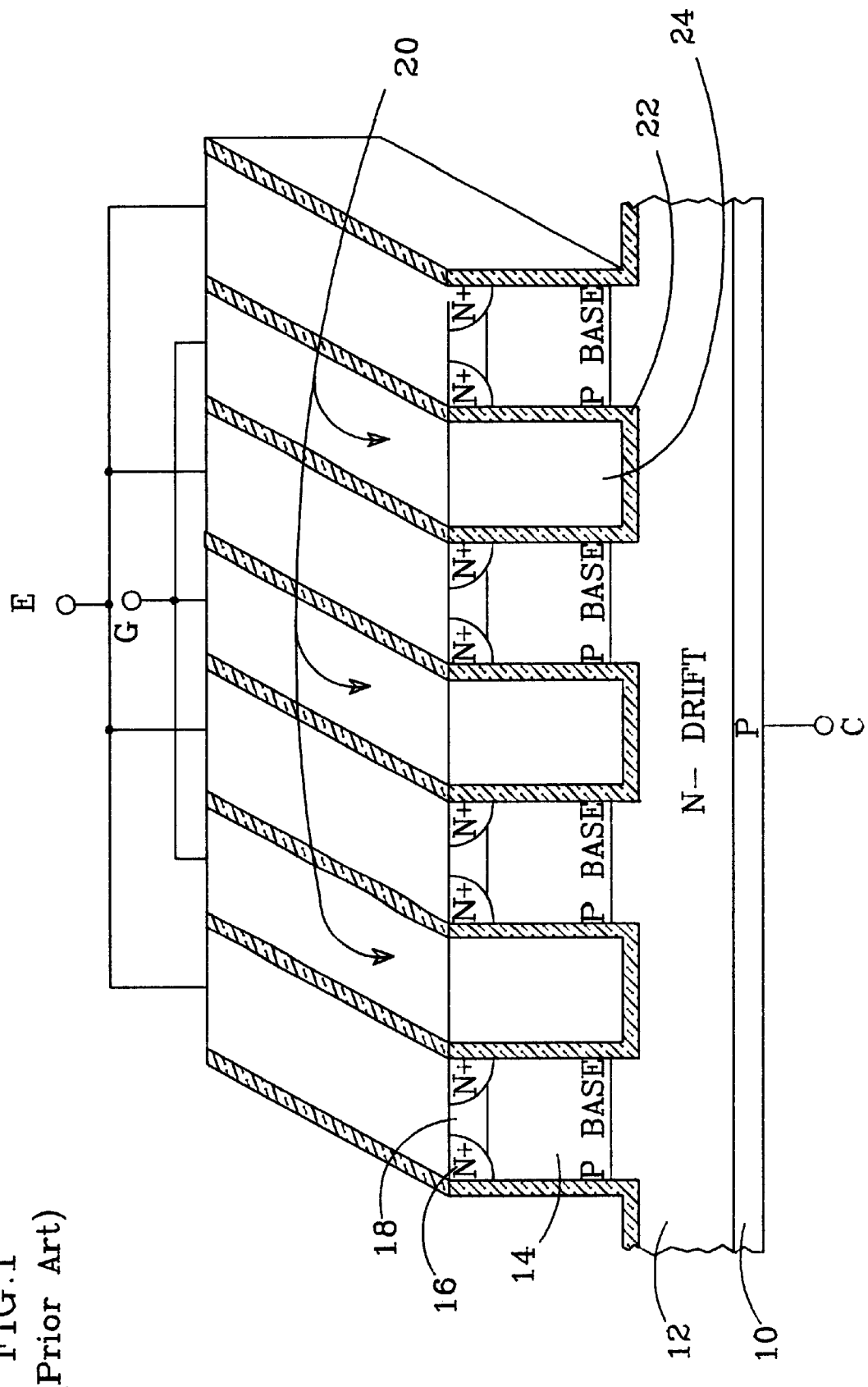
FIG. 1 is a sectional view of a trench-IGBT structure known in the prior art.
Figure 7:
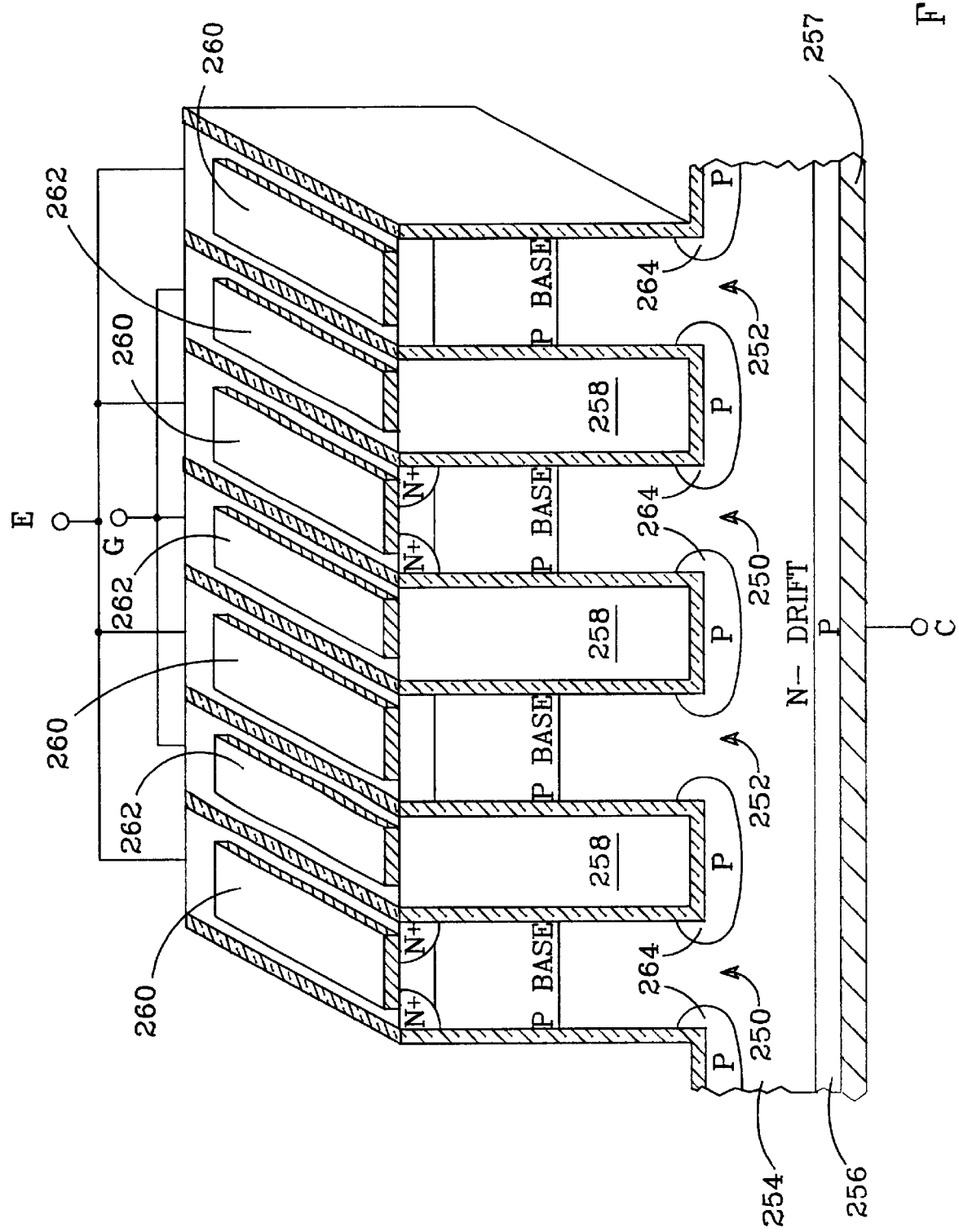
FIG. 7 is a perspective view of one embodiment of a multiple-cell implementation of a trench-IGBT with improved SOA per the present invention.

As noted above, to create a practical device capable of carrying a high current, a number of IGBT, BJT, and insulated gate structures as described above are interdigitated across the P/N− drift foundation; one embodiment of such a multi-cell device is shown in FIG. 7. Here, trench-shaped IGBT (250) and BJT (252) structures as shown in FIG. 1 are spaced periodically within a foundation made from an N− drift layer 254 on a P layer 256, with an electrode 257 on the P layer serving as the device's collector C. Insulated trench gate structures 258 are placed between every pair of IGBT and/or BJT structures. The electrodes 260 contacting each of the IGBT and BJT structures are connected together to form the device's emitter E, and the electrodes 262 contacting each of the gate structures are connected together to form the device's gate connection G. Shallow P regions 264 preferably extend from around the corners of each trench gate into N− drift layer 254.

The IGBT and bipolar transistor structures can be interdigitated in any desired manner, to tailor the device's performance for a particular application. The device's saturation current level can be adjusted by manipulating the ratio of IGBT structures to bipolar transistor structures, with the saturation current level increased or decreased by increasing or decreasing the ratio, respectively. For example, two BJT structures could be fabricated between each IGBT structure; this would provide a saturation current level lower than would a device having an equal number of the two structures, but would produce a relative increase in forward voltage drop.

The shape of the interdigitated structures is not limited to that of the trench-shaped stripes shown in FIG. 7. One possible alternative embodiment is shown in the plan view of FIG. 8 (emitter, collector, and gate electrodes not shown for clarity). Here, cylindrical IGBT structures 300 are interdigitated with cylindrical BJT structures 302. Each IGBT structure is as described above, with a shallow P+ region 304 providing an ohmic contact to the P base region below it (not shown), surrounding by an N+ region 306 and built on a foundation made from an N– drift layer 310 on a P layer 312. Each BJT structure is also as described above, with a P+ ohmic contact 314 on a P base region (not shown) on the P/N– drift foundation 310, 312. Insulated trench gate structures are formed by surrounding each cylindrical IGBT and BJT structure with oxide walls 316, and horizontal oxide bottoms (not shown) traverse the areas between oxide walls. Shallow P regions (not shown) are preferably employed to protect the oxide corners of the trench gates from peak fields as described above.

Figure 9:
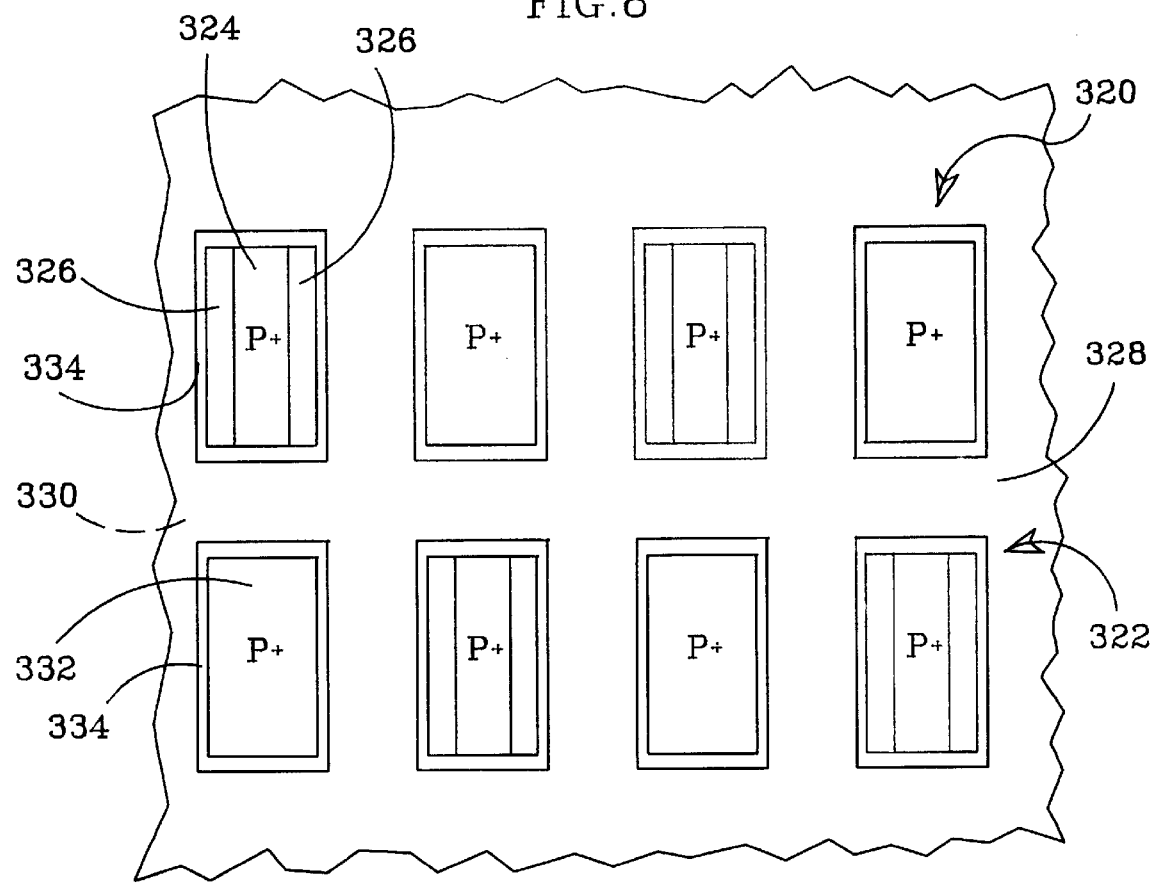
FIG. 9 is a plan view of another possible embodiment of a multiple-cell implementation of a trench-IGBT with improved SOA per the present invention.

Another possible multi-cell embodiment is shown in the plan view of FIG. 9 (emitter, collector, and gate electrodes not shown for clarity) . Here, the continuous stripe trench structures shown in FIG. 7 are broken up into smaller IGBT structures 320 and BJT structures 322. Each IGBT structure has a shallow P+ region 324 providing an ohmic contact to the P base region below it (not shown), surrounding by an N+ region 326 and built on a foundation made from an N– drift layer 328 on a P layer 330. Each BJT structure has a P+ ohmic contact 332 on a P base region (not shown) on the P/N– drift foundation 328, 330. Insulated trench gate structures are formed by surrounding each IGBT and BJT structure with oxide walls 334, and horizontal oxide bottoms (not shown) traverse the areas between oxide walls. Shallow P regions (not shown) are preferably employed to protect the oxide corners of the trench gates from peak fields as described above. Breaking up the structures in this way may result in a more uniform turn-on characteristic for the device.

Figure 8:
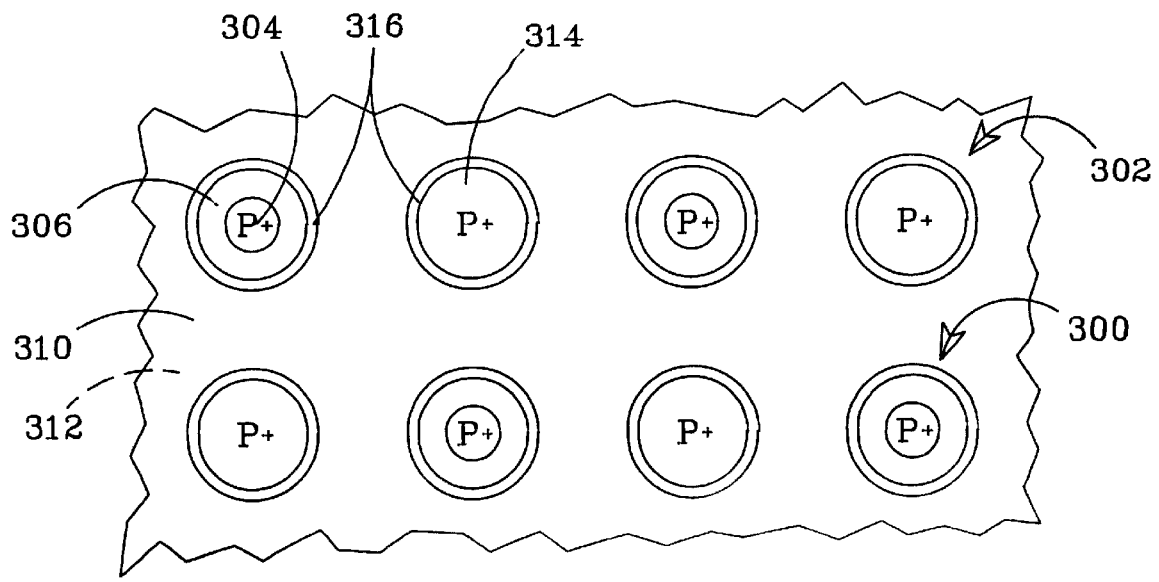
FIG. 8 is a plan view of one embodiment of a multiple-cell implementation of a trench-IGBT with improved SOA per the present invention.

The configurations shown in FIGS. 7, 8 and 9 are merely exemplary; many other structure shapes (including, for example, squares, squares with rounded corners, and hexagons), and structure ratios (number of IGBT structures/number of BJT structures) could be used to provide a functional device. The trench-shaped stripe structures of FIG. 7 are preferred, as they provide good performance while being easily fabricated. Though not depicted, a multi-cell device could also be implemented with structures of the opposite polarity (per FIG. 4), with shallow N regions below the trench bottoms to enhance the trench oxide's reliability.

The described devices can be fabricated on punch-through wafers (EPI), in which the drift layer comprises an epitaxial layer grown to a desired thickness and with a proper doping level on a bulk substrate material. The devices can also be fabricated on non-punch-through (NPT) wafers, in which the drift region is a bulk substrate material, and the P layer (such as layer 102 in FIG. 2) is a thin layer of a material doped with boron which has been implanted or diffused from the backside. Several factors should be considered when determining which wafer-type to use. EPI wafers are more expensive than NPT wafers, but because the epitaxial layer has a controlled thickness and doping concentration, they offer a lower forward voltage drop. An NPT-based device will have a lower hole injection efficiency (if configured per FIGS. 2 or 7) or a lower electron injection efficiency (if configured per FIG. 4) than an EPI-based device, and this property can be used to manipulate the stored charge and provide a better switching characteristic. In contrast, lifetime control is used to adjust the stored charge in an EPI-based device. The blocking voltage of the device is affected by the doping level and thickness of the drift layer; a doping level and thickness sufficient to provide a blocking voltage of at least 600 volts is preferred.

The performance of the IGBT is affected by the widths and depths of the trench gates, and by the mesa widths of the IGBT and BJT structures. A trench width of about 2–3 $\mu$m, a mesa width of about 3–6 $\mu$m, and a trench depth of about 10 $\mu$m is preferred, which provides good performance while being practical to fabricate.

While particular embodiments of the invention have been shown and described, numerous variations and alternate embodiments will occur to those skilled in the art. Accordingly, it is intended that the invention be limited only in terms of the appended claims.

I claim:

1. A trench insulated-gate bipolar transistor (IGBT) device with improved safe-operating area (SOA), comprising:

an IGBT structure, comprising:
   a P layer,
   a first electrode which contacts said P layer providing a collector connection for said device,
   an N– drift layer on said P layer opposite said collector,
   a first P base region on said N– drift layer,
   a N+ region on said first P base region, and
   a second electrode which contacts both said first P base region and said N+ region;

a bipolar transistor (BJT) structure adjacent to said IGBT structure, comprising:
   said P layer,
   said N– drift layer,
   a second P base region on said N– drift layer,
   a third electrode which contacts said second P base region, said second and third electrodes connected together and providing an emitter connection for said device; and an insulated gate arranged in a trench configuration recessed into said N– drift layer between said IGBT structure's N+ and P base regions and said BJT structure's P base region, comprising;
   a layer of oxide in contact with said N+ region, said first P base region, said N– drift layer, and said second P base region, said layer of oxide forming the sidewalls and bottom of said trench gate,
   a conductive material within said trench which connects a voltage applied to the top of said trench to said layer of oxide,
   a shallow P region in said N– drift layer directly adjacent to said trench gate bottom opposite said conductive material which spans the corners formed at the junctions of said sidewalls and said bottom to protect said corners from high peak electric fields when said device is reverse-biased, and
   a fourth electrode which contacts said conductive material providing a gate connection for said device;

a positive voltage applied to said gate connection forming an inversion channel across said first P base region and an accumulation channel along the gate sidewall below said first P base region which provides a conductive path between said N+ region and said N− drift layer that enables electrons to be injected from said N+ region into said N− drift layer, said injection of electrons enabling said IGBT structure and said BJT structure to be turned on when the voltage across said collector and emitter is sufficiently high and thereby allowing current to flow between said collector and said emitter connections via both IGBT and BJT structures, a zero or negative gate voltage eliminating said inversion channel and terminating conduction through the device, said insulated gate recessed into said N− drift layer to a depth sufficient to enable said accumulation channel to enhance the injection of said electrons from said N+ region to said N− drift layer and thereby lower the forward voltage drop between said collector and said emitter of said IGBT device when compared with an otherwise-identical device having a substantially shallower insulated gate depth.

2. The IGBT device of claim 1, further comprising P+ regions on said first and second P base regions to provide ohmic contacts to said first and second P base regions, respectively.

3. The IGBT device of claim 1, wherein the depth of said first P base region is about 3 $\mu$m and the depth of said insulated gate is about 10 $\mu$m.

4. The IGBT device of claim 1, wherein said shallow P region has a depth of less than 0.5 $\mu$m.

5. The IGBT device of claim 1, wherein said IGBT device comprises a plurality of said IGBT structures, a plurality of said BJT structures, and a plurality of said insulated gates located adjacent to respective ones of said structures, the portion of each structure located between its adjacent insulated gates defining the structure's mesa region, further comprising an N-type layer within said N− drift layer which extends above and below the portions of said shallow P region that encroach into said mesa regions, said N-type layer lowering the resistance across said mesa regions that is otherwise increased by said encroachment.

6. The IGBT device of claim 1, wherein said IGBT device comprises a plurality of said IGBT structures, a plurality of said BJT structures, and a plurality of said insulated gates located adjacent to respective ones of said structures, the portion of each structure located between its adjacent insulated gates defining the structure's mesa region, further comprising an N-type layer which extends from the bottoms of said first and second P base regions to below the portions of said shallow P region that encroach into said mesa regions, said N-type layer lowering the resistance across said mesa regions that is otherwise increased by said encroachment.

7. The IGBT device of claim 1, wherein said second P base region is diffused to at least the bottom of said trench gate to lower the forward voltage drop across said BJT structure.

8. The IGBT device of claim 1, wherein said IGBT device comprises a plurality of said IGBT structures, a plurality of said BJT structures, and a plurality of said insulated gates located adjacent to respective ones of said structures, the portion of each BJT structure located between its adjacent insulated gates defining the BJT structure's mesa region, said shallow P region spanning the corners formed at the junctions of said sidewalls and said bottom and extending across said BJT structure's mesa region, said extension of said shallow P region across said BJT structure's mesa region lowering the forward voltage drop across said BJT structure.

9. The IGBT device of claim 8, wherein the portion of each IGBT structure located between its adjacent insulated gates define the IGBT structure's mesa region, further comprising an N-type layer which extends above and below the portions of said shallow P region that encroach into said IGBT structure's mesa region, said N-type layer lowering the resistance across said IGBT structure's mesa region that is otherwise increased by said encroachment.

10. A trench insulated-gate bipolar transistor (IGBT) device with improved safe-operating-area (SOA), comprising:
an IGBT structure, comprising:
a N layer,
a first electrode which contacts said N layer providing an emitter connection for said device,
a P− drift layer on said N layer opposite said emitter,
a first N base region on said P− drift layer,
a P+ region on said first N base region, and
a second electrode which contacts both said first N base region and said P+ region;
a bipolar transistor (BJT) structure adjacent to said IGBT structure, comprising:
said N layer,
said P− drift layer,
a second N base region on said P− drift layer,
a third electrode which contacts said second N base region, said second and third electrodes connected together and providing a collector connection for said device; and
an insulated gate arranged in a trench configuration recessed into said P− drift layer between said IGBT structure's P+ and N base regions and said BJT structure's N base region, comprising:
a layer of oxide in contact with said P+ region, said first N base region, said P− drift layer, and said second N base region, said layer of oxide forming the sidewalls and bottom of said trench gate,
a conductive material within said trench which connects a voltage applied to the top of said trench to said layer of oxide,
a shallow N region in said P− drift layer directly adjacent to said trench gate bottom opposite said conductive material which spans the corners formed at the junctions of said sidewalls and said bottom to protect said corners from high peak electric fields when said device is reverse-biased, and
a fourth electrode which contacts said conductive material providing a gate connection for said device;
a negative voltage applied to said gate connection forming an inversion channel across said first N base region and an accumulation channel along the gate sidewall below said first P base region which provides a conductive path between said P+ region and said P− drift layer that enables holes to be injected from said P+ region into said P− drift layer, said injection of holes enabling said IGBT structure and said BJT structure to be turned on when the voltage across said collector and emitter is sufficiently high and thereby allowing current to flow between said collector and said emitter connections via both IGBT and BJT structures, a zero or positive gate voltage eliminating said inversion channel and terminating conduction through the device, said insulated gate recessed into said P− drift layer to a depth sufficient to enable said accumulation channel to enhance the injection of said holes from said P+ region to said P– drift layer and thereby lower the forward voltage drop of said IGBT device when compared with an otherwise-identical device having a substantially shallower insulated gate depth.

11. The IGBT device of claim 10, wherein the depth of said first N base region is about 3 μm and the depth of said insulated gate is about 10 μm.

12. A trench insulated-gate bipolar transistor (IGBT) device with improved safe-operating-area, comprising:
a first electrode which provides a collector connection for said device,
a P layer on said first electrode,
an N– drift layer on said P layer opposite said first electrode,
a plurality of IGBT structures, each comprising:
said P layer,
said N– drift layer,
a first P base region on said N– drift layer,
a N+ region on said first P base region, and
a second electrode which contacts both said first P base region and said N+ region;
a plurality of bipolar transistor (BJT) structures, each comprising:
said P layer,
said N– drift layer,
a second P base region on said N– drift layer,
a third electrode which contacts said second P base region, each of said second electrodes and said third electrodes connected together to provide an emitter connection for said device; and
a plurality of insulated gates, each of said insulated gates arranged in a trench configuration and recessed into said N– drift layer and separating said IGBT structures' N+ and P base regions and said BJT structures' P base regions from other ones of said IGBT structures' N+ and P base regions and said BJT structures' P base regions, each of said insulated gates comprising:
a layer of oxide in contact with the N+ and P base region of an IGBT structure when said gate contacts one of said IGBT structures, the P base region of a BJT structure when said gate contacts one of said BJT structures, and said N– drift layer, said layer of oxide forming the sidewalls and bottom of said trench gate,
a conductive material within said trench which connects a voltage applied to the top of said trench to said layer of oxide,
a shallow P region in said N– drift layer directly adjacent to said trench gate bottom opposite said conductive material which spans the corners formed at the junctions of said sidewalls and said bottom to protect said corners from high peak electric fields when said device is reverse-biased, and
a fourth electrode which contacts said conductive material, each of said fourth electrodes connected together to provide a gate connection for said device;
a positive voltage applied to said gate connection forming inversion channels across each of said first P base regions and accumulation channels along the gate sidewalls below said first P base regions which provide conductive paths between each of said N+ regions and said N– drift layer that enable electrons to be injected from said N+ regions into said N– drift layer, said injection of electrons enabling said IGBT structures and said BJT structures to be turned on when the voltage across said collector and emitter is sufficiently high and thereby allowing current to flow between said collector and said emitter connections via both IGBT and BJT structures, a zero or negative gate voltage eliminating said inversion channels and terminating conduction through the device, said insulated gates recessed into said N– drift layer to a depth sufficient to enable said accumulation channels to enhance the injection of said electrons from said N+ regions to said N– drift layer and thereby lower the forward voltage drop of said IGBT device when compared with an otherwise-identical device having a substantially shallower insulated gate depth,
the ratio of said IGBT structures to said BJT structures determining the saturation current level of said device, said ratio selected to provide a desired saturation current level and short-circuit SOA.

13. The IGBT device of claim 12, wherein the depth of each of said first P base regions is about 3 μm and the depth of each of said insulated gates is about 10 μm.

14. The IGBT device of claim 12, wherein said device resides on a die in which said P layer and said N– drift layer run the length and width of said die.

15. The IGBT device of claim 14, wherein said IGBT structures and said BJT structures are cylindrical and are spaced periodically across the length and width of said die.

16. The IGBT device of claim 14, wherein said IGBT structures and said BJT structures are trench-shaped, run the length of said die, and are spaced periodically across the width of said die.

17. The IGBT device of claim 16, wherein each of the trench-shaped IGBT and BJT structures which run the length of said die are divided into a plurality of individual structures spaced periodically along the length of said die, the space between each of said individual structures occupied with a respective one of said insulated gates.

18. The IGBT device of claim 12, wherein said IGBT structures, BJT structures, and insulated gates are interdigitated in said N– drift layer, each of said insulated gates positioned between a respective pair of said IGBT structures, a respective pair of said BJT structures, or a respective pair comprising one of said IGBT structures and one of said BJT structures.

19. The IGBT device of claim 12, Wherein said N– drift layer is a bulk substrate material and said P layer is implanted or diffused into the backside of said N– drift layer.

20. The IGBT device of claim 12, wherein said P layer is a bulk substrate material and said N– drift layer is an epitaxial layer grown on said P layer.

21. A trench insulated-gate bipolar transistor (IGBT) device with improved safe-operating-area (SOA), comprising:
a first electrode which provides a collector connection for said device,
a P layer on said first electrode,
an N– drift layer on said P layer opposite said first electrode,
a plurality of IGBT structures, each comprising:
said P layer
said N– drift layer
a first P base region on said N– drift layer,
a first shallow P+ region on said first P base region to provide an ohmic contact to said first P base region,
a N+ region on said first P base region, and
a second electrode which contacts both said first shallow P+ region and said N+ region;
a plurality of bipolar transistor (BJT) structures, each comprising:

said P layer,
said N− drift layer,
a second P base region on said N− drift layer,
a second P+ region on said second P base region to provide an ohmic contact to said second P base region, and
a third electrode which contacts said second shallow P+ region, each of said second electrodes and said third electrodes connected together to provide an emitter connection for said device; the width of said first and second P base regions defining the mesa regions of said IGBT and BJT structures, respectively;

a plurality of insulated gates, each of said insulated gates arranged in a trench configuration and recessed into said N− drift layer and separating said IGBT structures' N+ and P base regions and said BJT structures' P base regions from other ones of said IGBT structures' N+ and P base regions and said BJT structures' P base regions, the portion of a structure located between its adjacent insulated gates defining its mesa region, each of said insulated gates comprising:
  a layer of oxide in contact with the N+ and P base region of an IGBT structure when said gate contacts one of said IGBT structures, the P base region of a BJT structure when said gate contacts one of said BJT structures, and said N− drift layer, said layer of oxide forming first and second approximately vertical sidewalls and an approximately horizontal bottom between said sidewalls which contacts said N− drift region,
  a conductive material within said trench which connects a voltage applied to the top of said trench to said layer of oxide,
  a fourth electrode which contacts said conductive material, each of said fourth electrodes connected together to provide a gate connection for said device, and
  a shallow P region in said N− drift layer directly adjacent to said horizontal bottom opposite said conductive material which spans the corners formed at the junctions of said vertical sidewalls and said horizontal bottom to protect said corners from high peak electric fields when said device is reverse-biased; and
an N-type layer which extends above and below the portions of said shallow P region that encroach into said mesa regions, said N-type layer lowering the resistance across said mesa regions that is otherwise increased by said encroachment;
a positive voltage applied to said gate connection forming inversion channels across each of said first P base regions and accumulation channels along the gate sidewalls below said first P base regions which provide conductive paths between each of said N+ regions and said N− drift layer that enable electrons to be injected from said N+ regions into said N− drift layer, said injection of electrons enabling said IGBT structures and said BJT structures to be turned on when the voltage across said collector and emitter is sufficiently high and thereby allowing current to flow between said Collector and said emitter connections via both IGBT and BJT structures, a zero or negative gate voltage eliminating said inversion channels and terminating conduction through the device, said insulated gates recessed into said N− drift layer to a depth sufficient to enable said accumulation channels to enhance the injection of said electrons from said N+ regions to said N− drift layer and thereby lower the forward voltage drop of said IGBT device when compared with an otherwise-identical device having a substantially shallower insulated gate depth,
  the ratio of said IGBT structures to said BJT structures determining the saturation current level of said device, said ratio selected to provide a desired saturation current level.

22. The IGBT device of claim 21, wherein the depth of each of said first P base regions is about 3 μm and the depth of each of said insulated gates is about 10 μm.

* * * * *